United States Patent [19]
Berg et al.

[11] Patent Number: 5,936,568
[45] Date of Patent: Aug. 10, 1999

[54] LOW RADAR CROSS-SECTION (RCS) SUPPORT PYLON AND LOW RCS MEASUREMENT SYSTEM EMPLOYING SAME

[75] Inventors: Donald J. Berg, Mesa, Ariz.; Carl A. Mentzer, Poway, Calif.; Paul T. Fisher, Scottsdale, Ariz.

[73] Assignee: McDonnell Douglas Corporation, St. Louis, Mo.

[21] Appl. No.: 09/020,341

[22] Filed: Feb. 9, 1998

[51] Int. Cl.[6] .............................. G01S 7/40; H01Q 17/00
[52] U.S. Cl. ................... 342/1; 342/4; 342/165
[58] Field of Search ................... 342/1, 2, 3, 4, 342/165, 173

[56] References Cited

U.S. PATENT DOCUMENTS

| | | | |
|---|---|---|---|
| 4,713,667 | 12/1987 | Poirier et al. | 342/192 |
| 4,809,003 | 2/1989 | Dominek et al. | 342/165 |
| 4,879,560 | 11/1989 | McHenry | 342/165 |
| 4,901,080 | 2/1990 | McHenry | 342/1 |
| 4,931,798 | 6/1990 | Kogo | 342/4 |
| 4,947,175 | 8/1990 | Overholser | 342/165 |
| 4,990,923 | 2/1991 | Delfeld | 342/165 |
| 5,028,928 | 7/1991 | Vidmar et al. | 342/10 |
| 5,075,681 | 12/1991 | Kartiala | 342/165 |
| 5,099,244 | 3/1992 | Larson | 342/165 |
| 5,311,191 | 5/1994 | Scannapieco | 342/165 |

*Primary Examiner*—John B. Sotomayor
*Attorney, Agent, or Firm*—Westerlund & Powell, P.C.; Raymond H.J. Powell, Jr.; Robert A. Westerlund

[57] ABSTRACT

A support member for a measurement chamber, which measurement chamber surrounds a target of interest intersected by a line defined by focal points associated with the measurement chamber, and which chamber separates and extracts unwanted scattered signals from the measurement chamber, the measurement chamber including a chamber section having an interior defined by rotation of a nonlinear curve about the line, and first and second focusing elements which couple the scattered signals out of the chamber section, includes a surface for attaching at least one of the target of interest and a source generating signals scattered by the target of interest and a sting element which is coaxial with the line and which is coincident with one of the focal points. According to one aspect of the present invention, the source is attached to the surface and supported by a sting element which is defined a body of rotation about the line. According to another aspect of the present invention, the target of interest, which is disposed between the source and the sting element, is attached to the surface. Preferably, selected surfaces of the support element are covered by radar absorbing material. According to another aspect of the present invention, first and second support elements are provided to support the source and target of interest, respectively. Low RCS measurement chambers and systems are also described.

25 Claims, 8 Drawing Sheets

TARGET

FIG. 2A

312 "TOP-HAT" ROTATOR

316 MIDDLE SECTION

III III

318 PIVOT POINT

314 FRONT SECTION

320 RAS EDGE

316 MIDDLE SECTION

LOW RADAR CROSS-SECTION (RCS) SUPPORT PYLON AND LOW RCS MEASUREMENT SYSTEM EMPLOYING SAME

BACKGROUND OF THE INVENTION

The present invention relates generally to radar cross-section (RCS) and antenna pattern measurement ranges. More specifically, the present invention relates to low RCS support/sting pylons for use with low RCS and antenna pattern measurement ranges. The low RCS support/sting pylon are particularly advantageous when employed with a geometrically shaped measurement chamber, which removes substantially all but direct path backscattered signals from the target of interest. The present invention also relates to high performance anechoic chambers for antenna pattern measurement. A low RCS measurement system which exploits the novel low RCS support/sting pylons is also disclosed.

A radar system tracks a target in response to an echo, i.e., a reflected portion of the incident radar signal, from the target of interest. Therefore, it is critical to the design and operation of radar systems to be able to quantify, or otherwise describe this echo, particularly in terms of target characteristics, e.g., size, shape and/or orientation. One such characteristic is radar cross-section (RCS), which is the projected area of a metal sphere returning the same echo signal as the target of interest, assuming the metal sphere is substituted for the target of interest. Unlike the echo signal from a sphere, which is orientation independent, the echo signal, and thus the RCS, varies as a function of orientation of the target of interest. This variation can be very rapid, especially when the target of interest is many wavelengths in size.

RCS values of simple bodies can be computed exactly by solution of a wave equation defined in a coordinate system for which a constant coordinate coincides with the surface of the body. However, there is no known tactical target of interest which fits these solutions. The practical engineer cannot rely on predictions and calculations; the engineer must eventually measure the echo characteristics of the target of interest. This measurement can be performed on a full scale target of interest on an outdoor test range or on scale models to the target of interest in a measurement chamber. Current state of the art ranges include "compact ranges" which use a collimating reflector system to achieve the desired electromagnetic field distribution in the measurement zone (target area), i.e., to simulate a wide separation between the radar source and the target of interest.

Typical RCS chambers are rectangular rooms covered with Radar Absorber Materials (RAM). For a given target support system and antenna/radar system, the chamber performance is limited by the chamber size and shape and by absorber material employed. Cost limitations usually drive both the chamber size and the quantity and quality of the RAM installed in the chamber. The measurement capability in RCS chambers is limited by several factors, including:

(a) the chamber size and shape;

(b) the type and amount of RAM applied to the chamber walls;

(c) the target support system; and (d) the antenna/radar system.

With respect to factors (a) and (b), the room, i.e., measurement chamber itself, is often the limiting factor in RCS measurement chambers. Radar reflections or echo signals are generated by scattering from the target of interest. Echo signals which are not direct path generally arrive at a later that the direct path backscattered signals and, thus, can contaminate the RCS measurement. The conventional method of "quieting" the radar reflections from the room itself is by treating the chamber walls with large pyramidal RAM up to six feet deep that attenuates the incident microwave energy. With respect to factor (d), radar range (time) "gating" (either true short pulse or synthetic short pulse) may be used to remove most radar scattered signals that arrive at the radar at a time other than the desired return from the target. However, since RAM provides only limited attenuation and since radar range (time) gating cannot provide echo signal cancellation to completely eliminate unknown short bounce interaction, the RCS measurement is usually contaminated by spurious echo signals. In other words, some diffuse returns from the absorber as well as some chamber wall returns will arrive at the radar at the same time as the desired target backscattered and cannot be gated out. In particular, surfaces perpendicular to the chamber long axis, such as those associated with conventional target and source supports, are especially prone to causing spurious or unwanted scattered signals. These scattered signals establish the background levels of the chamber. Since the target should be at least 10 decibels ($dB_{SM}$) above the background level, this background level also establishes the limit on the lowest RCS target which can be measured using a given range.

With respect to factor (c), attempts have been made over the years to reduce the spurious scattered signals which contaminate RCS measurement, particularly those generated by the support for the target of interest, since the target support pylon is one of the main factors which limits the measurement capability of existing RCS measurement ranges. The three different kinds of support structures which are generally used in RCS measurement schemes are discussed immediately below.

(1) Low Density Plastic Foam Columns. U.S. Pat. No. 5,099,244 discloses a typical example of such a pylon. Such columns are not echo free. The echo from the plastic foam column is generated by two separate mechanisms, coherent surface reflections and a non-coherent volume contribution from the thousands of cells comprising the foam material. It will be appreciated that in order to minimize the RCS of the foam column, the pylon must use low dielectric constant materials which have a low density and, thus, have severe limits on the target weight which can be supported. One attempt to overcome the load limitation of foam columns was proposed in U.S. Pat. No. 5,028,928, which discloses a pylon formed from an inflatable stressed skin bladder having a low RCS value. It will also be noted that the physical attachment of the target to the foam limits the range of target elevation angles which can be measured. In addition, the RCS from the foam material increases at higher microwave frequencies, which limits the measurement capability, particularly with respect to scale model targets.

(2) String Suspension Harnesses. U.S. Pat. No. 5,075,681 discloses a cable support system of this type. The echo signal from a string depends on the length and diameter of the string, its tilt angle with respect to the incident wave, and its dielectric constant.

(3) Slender Metal Pylons. U.S. Pat. No. 4,990,923 discloses a pylon which includes an elongated support extending upwardly from a base to a tip on which the target of interest is mounted. The support inclines and curves in the direction of the radar source. The tip of the support, which is formed from RAM, is smoothly faired to the target. A typical metal pylon owes its electromagnetic performance to the sharpness of the leading edge and its tilt toward the radar source. RAM covered pylons are generally metallic structures of ogival cross section. These pylons have a leading edge, i.e., the edge facing the radar, which is sloped toward the radar at approximately 28° from vertical, i.e., perpendicular to the long axis of the low RCS measurement chamber. It should be mentioned that target elevation angles for this type of pylon are limited to "look down" angles only and viewing angles are limited by the target-to-pylon interface geometry. Radar Absorbing Structure (RAS) pylons of ogival cross section, or other more complex cross section, such as that disclosed in U.S. Pat. No. 4,809,003, for lower RCS levels, are similar to the RAM covered pylon described above. These pylons suffer the same target-to-pylon limitations due to the size of the top of the pylon.

A variation on this last configuration is disclosed in U.S. Pat. No. 4,713,667, wherein two vertical circular columns which are movable with respect to one another are provided to support the target of interest, and wherein the columns can be positioned so that radar reflections from the two columns will cancel one another.

What is needed is a low RCS target support/sting pylon which can be installed in a RCS measurement facility and which provides a target support structure with an extremely low RCS signature. Advantageously, the low RCS support/sting pylon produces minimal scattered signals, since the "sting pylon" has a minimal profile perpendicular to the long axis of the low RCS measurement chamber, i.e., since the radar is "looking" down the length of the horizontal target support pylon. Moreover, it would be beneficial if the low RCS target support/sting pylon provided a support structure wherein the target-to-pylon interface remains constant as the target is tilted in elevation. What is also needed is a low RCS support/sting pylon wherein the elevation tilt axis is behind the target and wherein the elevation joint, e.g., pivot element, is covered by an elastomeric conductive sheet, so as to provide a relatively low RCS contribution due to the elevation joint. The unwanted scattered signals advantageously could be further reduced by a low RCS source support/sting pylon which can be installed in a RCS measurement facility and which directs scattered signals out of the RCS measurement chamber.

SUMMARY OF THE INVENTION

Based on the above and foregoing, it can be appreciated that there presently exists a need in the art for a low radar cross-section (RCS) support/sting pylon suitable for an accurate RCS measurement chamber which overcomes the above-described deficiencies. The present invention was motivated by a desire to overcome the drawbacks and shortcomings of the presently available technology, and thereby fulfill this need in the art.

One advantage of the Low RCS target support/sting pylon (hereafter referred to simply as "target sting pylon") is that the target sting pylon provides a target support structure having an extremely low RCS signature, relative to a pylon having a substantial vertical, i.e., perpendicular to the long axis of the low RCS measurement chamber, profile (metal and foam pylons) and strings, since the radar is "looking" down the length of the horizontal support. In addition, a target elevation mechanism maintains the target-to-pylon interface constant as the target is tilted in elevation. Since the elevation tilt axis is behind the target and since the elevation joint advantageously can be covered by an elastomeric radar conductive sheet, the RCS contribution from the elevation joint is extremely low.

An additional advantage of a low RCS source support/sting pylon (hereinafter referred to as a "source sting pylon") is that the source support pylon directs or couples unwanted scattered signals from the walls of the RCS measurement chamber to a portion of the RCS measurement chamber where these scattered signals will no longer contribute to the background level in the chamber.

An object according to the present invention is to provide low RCS pylons for supporting both a target of interest and a source for a RCS measurement chamber which utilizes the geometric shaping and the physical optics features of an "ellipse" wherein the path of nearly all the scattered rays will pass through the focal points of each ellipse while missing the source. The scattered rays or signals advantageously can be coupled out of the RCS measurement chamber utilizing the combined action of the measurement chamber and the source support pylon, which eliminates the need for expensive, heavy absorbers on the walls of the RCS measurement chamber and complicated radar range (time) gating scenarios for scattered, but not absorbed, "rays."

Another object according to the present invention is to provide a RCS measurement chamber which, through geometrical shaping of both the measurement chamber and the target and source support pylons, removes all but the direct signals of the radar source back to itself, i.e., all but the backscattered signals. Preferably, the outer section of each ellipse is smoothly blended into an intersecting and coaxial "hyperbola," which advantageously couples the scattered "rays" or "signals" out of each end of the RCS measurement chamber. Moreover, the scattered signals directed toward the focal point "behind" the source, advantageously can be coupled into the adjacent hyperbolic section by the source support pylon. It will be appreciated that this system requires a relatively precise "self-contained" (horn/reflector/lens) system that emanates a narrow "far-field" beam to the target.

Still another object according to the present invention is to provide a RCS measurement system having low construction and maintenance costs. According to ones aspect of the present invention, large chambers can be fabricated in two halves using a single mold, which mold advantageously can be many meters long. According to another aspect of the present invention, RCS measurement chamber maintenance costs can be minimized by limiting chamber access by operating and/or maintenance personnel. It will be appreciated that access can be minimized if the target support pylon or antenna mast can be installed through the end of the chamber. The above-mentioned target sting pylon permits target change out without personnel entry into the low RCS measurement chamber. The RCS measurement chamber according to the present invention includes provisions for end access to the chamber.

These and other objects, features and advantages according to the present invention are provided by a support member for a measurement chamber, which surrounds a target of interest intersected by a line defined by focal points associated with the measurement chamber, and which separates and extracts scattered signals from the measurement chamber, the measurement chamber including a chamber having an interior defined by rotation of a nonlinear curve about the line, and first and second focusing elements which couple the scattered signals out of the chamber. Preferably, the support element includes a surface for attaching at least one of the target of interest and a source generating signals scattered by the target of interest and a sting element which is coaxial with the line and which is coincident with one of the focal points.

According to one aspect of the present invention, the source is attached to the surface and supported by a sting element which is defined a body of rotation about the line. The body of rotation advantageously can envelope the source. According to another aspect of the present invention, the target of interest, which is disposed between the source and the sting element, is attached to the surface. Preferably, selected surfaces of the support element are covered by radar absorbing material. According to another aspect of the present invention, first and second support elements are provided to support the source and target of interest, respectively.

These and other objects, features and advantages according to the present invention are provided by a combination, including a chamber device which surrounds a target of interest intersected by a line defined by focal points associated with the chamber device, for separating and extracting scattered signals scattered by the target of interest, the chamber device including a chamber body having an interior defined by rotation of a nonlinear curve about the line, and first and second focusing elements which couple the scattered signals out of the chamber body; and a support for supporting at least one of the target of interest and a source generating signals scattered by the target of interest; wherein the support is coaxial with the line and wherein the support is coincident with one of the focal points.

These and other objects, features and advantages according to the present invention are provided by a measurement system including:

a measurement chamber which surrounds a target of interest intersected by a line defined by focal points associated with the measurement chamber and which separates and extracts scattered signals from the measurement chamber, the measurement chamber including at least one chamber having an interior defined by rotation of a nonlinear curve about the line, and first and second focusing elements which couple the scattered signals out of the chamber;

a signal source which emits signals along the line, wherein the emitted signals interact with the measurement chamber to thereby produce the scattered signals;

a source support pylon which supports the source and which couples the scattered signals out of the chamber; and a target support pylon, which supports the target of interest at one of the focal points, and which is coaxial with the line.

According to one aspect of the present invention, the target support pylon includes a first end proximate to the source to which the target of interest is attached, a second end, which is disposed outside of the measurement chamber, the second end further comprising means for adjusting the attitude of the target support pylon with respect to the line, and a pivot element about which the target support pylon pivots. Preferably, the measurement system also includes a cart supporting the target support pylon at the pivot element, and rails for supporting the cart, wherein the target of interest is removed from the chamber by moving the cart along the rails in a first direction, and wherein the target of interest is installed in the chamber by moving the cart along the rails in a second direction opposite to the first direction. According to another aspect of the present invention, the source support pylon includes a body of rotation about the line, and wherein the source support pylon couples the scattered signals into one of the first and second focusing elements.

These and other objects, features and advantages of the invention are disclosed in or will be apparent from the following description of preferred embodiments.

BRIEF DESCRIPTION OF THE DRAWINGS

These and various other features and aspects of the present invention will be readily understood with reference to the following detailed description taken in conjunction with the accompanying drawings, in which like or similar numbers are used throughout, and in which:

FIG. 6A is an illustration of a low RCS source support/sting pylon according to still another preferred embodiment of the present invention while

DETAILED DESCRIPTION OF THE PREFERRED EMBODIMENTS

Figure 1A:
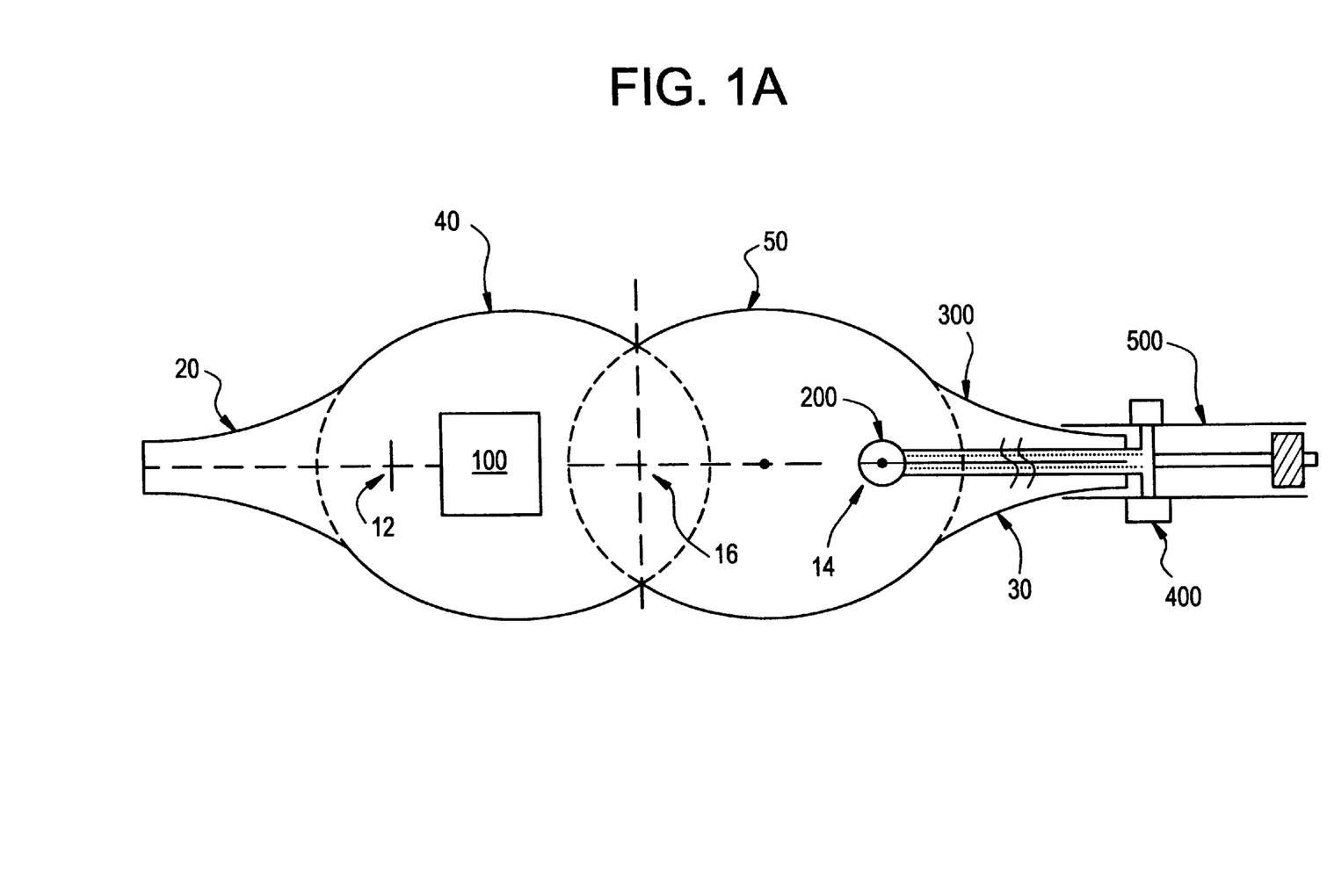
FIG. 1A is an interior view of a low RCS measurement including a low RCS target support pylon/sting according to a preferred embodiment of the present invention.

By way of introduction, a "shaped" low RCS measurement chamber provides an optimal background level through careful shaping of the measurement chamber itself combined with the selective use of RAM and radar range (time) gating. Preferably, the shaped RCS measurement chamber is a body of revolution about an axis running through the center of the target measurement zone. The shape of the RCS chamber advantageously can be selected to meet the measurement requirements for the device, e.g., target or antenna, under test. An exemplary preferred embodiment of a low RCS measurement chamber according to the present invention is illustrated in FIG. 1A.

Before discussing any of the preferred embodiments according to the present invention, it will be helpful to establish the terminology used throughout this section. A source 100, which in an exemplary case can be a collimating source or the like, generates emitted signals, which are directed toward the target of interest 200. A portion of the emitted signals scattered by the target of interest 200 will be returned in the direction of the source 100; these signals will hereinafter be referred to as backscattered signals. Another portion of the emitted signals will impinge on the target of interest 200 and be scattered in various directions. These latter signals will impinge on the RCS measurement chamber walls and be re-scattered; henceforth these signals will be referred to as scattered signals. It will be appreciated that a portion of the emitted signals will miss the target of interest 200 completely. Since those signals will also interact with the walls of the RCS measurement chamber, and thus be indistinguishable from scattered signals, those signals will also be referred to as scattered signals.

An exemplary preferred embodiment according to the present invention utilizes geometric shaping and physical optics to form a geometrically shaped chamber, e.g., a series of elliptical chambers 40, 50, wherein the paths of substantially all the reflected rays, i.e., scattered rays, advantageously will pass through focal points 12 and 16, while simultaneously missing the source 100 producing the emitted signal. It will be appreciated that this eliminates the need for expensive, heavy absorbers on the walls of the measurement chamber. Alternative configurations of the low RCS measurement chamber portion of the low RCS measurement system are provided in commonly assigned, co-pending application, Ser. No. (Atty. Docket No. MDHS-370), which application is incorporated herein by reference for all purposes.

The shaped low RCS measurement chamber of the low RCS measurement system according to the present invention utilizes geometrical shaping to achieve background levels better than those available from conventional chambers. The geometric shaping is performed through the use of physical optics (ray tracing) techniques. The objective of the shaping analysis in the design of the RCS measurement chamber is to define chamber shapes which minimize the need for RAM on the chamber walls. The ideal RCS measurement system will allow "plane wave" far field energy into the antenna/radar system to measure the far field RCS or antenna pattern while, at the same time, excluding substantially all of the energy scattered by the target or antenna in other directions. Thus, a major benefit of the shaped chamber is that an "ideal" RCS measurement system advantageously can be approached through careful shaping of the chamber itself, combined with the selective use of RAM and radar range (time) gating. Additional details regarding the exemplary low RCS measurement chamber are presented immediately below.

The shaped chamber lends itself to the use of a collimating system, i.e., source 100, as shown generally in FIG. 1A and more specifically in FIGS. 5, and 6A, which are discussed in greater detail below. Any of the conventional reflectors in use today, e.g., primary focus reflectors, Schmidt reflectors, Cassegrain reflectors, or Gregorian feed reflectors advantageously may be adapted to the specific design criteria employed by the RCS measurement system. It should be mentioned that this is necessary to minimize or optimize the source support structure inside the RCS measurement chamber to thereby keep internal reflections, which would be seen as background noise, to an absolute minimum. Several preferred embodiments of a source sting pylon, which provides a minimally intrusive support system, are discussed in greater detail below with respect to FIGS. 5, 6A and 6B.

A first preferred embodiment of the low RCS measurement system according to the present invention will now be discussed with respect to FIG. 1A, wherein a low RCS measurement chamber consisting of a series of elliptical chambers 40 and 50, having first and second focal points 12 and 14 and a common focal point 16 is illustrated. Advantageously, the chambers 40, 50, can be joined to first and second focusing elements 20 and 30, respectively, such that the interior surfaces of the elliptical chambers 40 and 50 intersect and make smooth transitions with focusing elements 20 and 30. As discussed in greater detail below, focusing elements 20 and 30 focus, force or couple the scattered signals out of the elliptical portions of the low RCS measurement chamber. Advantageously, elements 20 and 30 can focus the reflected signal onto RAM 22 and RAM 32, respectively.

Figure 5:
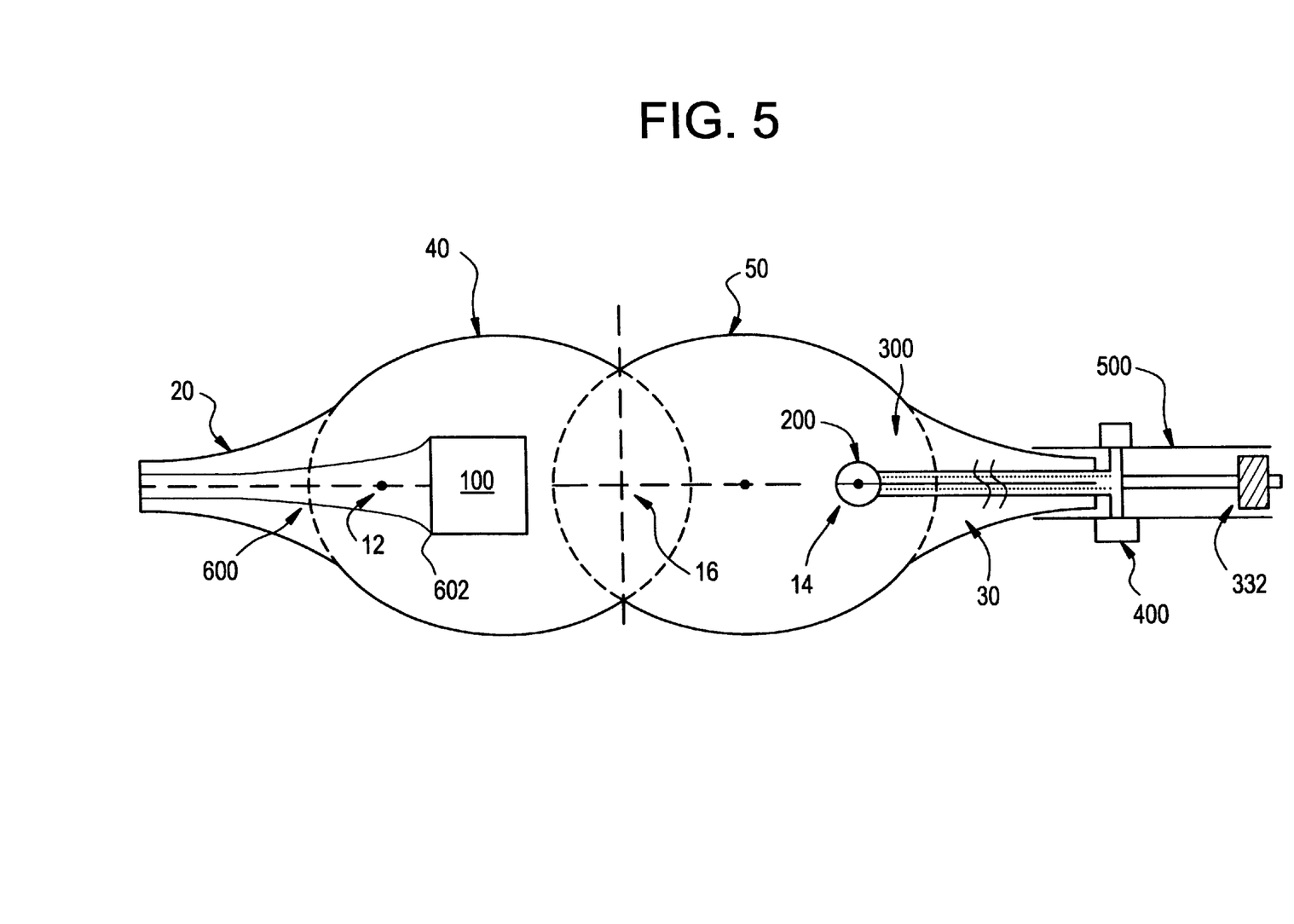
FIG. 5 is an illustration of a low RCS source support/sting pylon according to another preferred embodiment of the present invention.
Figure 6A:
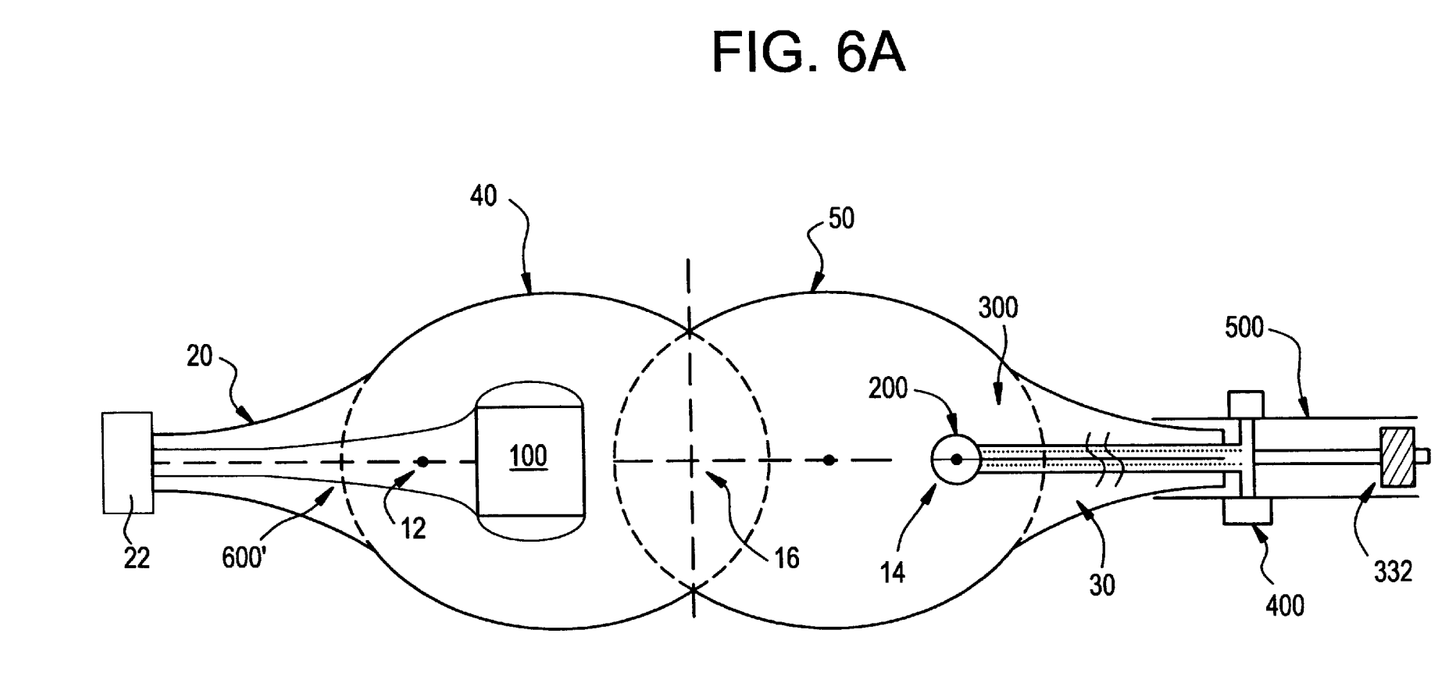

Thus, the "dual-ellipse" RCS measurement chamber of FIGS. 1A, 5, and 6A uses two elliptical chambers 40 and 50 which share a common focus 16 at the center of the chamber. By placing the collimating feed/radar system 100 between the foci 12 and 16 of the ellipse 40 and by placing the target 200 at the focus 14 of the ellipse 50, the arrangement ensures that only the backscattered signals from the target 200 reach the feed and that none of the reflected signals scattered by the target 200 in other directions arrive at the feed, i.e., source 100. This is assured by the fact that any scattered signal emanating from one focus of the ellipse 50 will pass through the common focus of ellipses 40, 50 after reflection from the elliptical chamber wall. In this manner, the need for high quality radar range (time) gating for the radar system and the provision of RAM on the walls of the RCS measurement chamber can be minimized.

Preferably, the focusing elements 20 and 30 can be of any shape, although non-linear geometries are particularly beneficial. For example, the focusing elements 20 and 30 advantageously can be hyperbolas, although parabolas can also be employed. It should also be mentioned that the volume of the RCS measurement chamber illustrated in FIG. 1A is the swept volume of the elliptical chambers 40 and 50 and the focusing elements 20 and 30. Preferably, the axis of rotation includes focal points 12, 14 and 16.

Figure 1B:
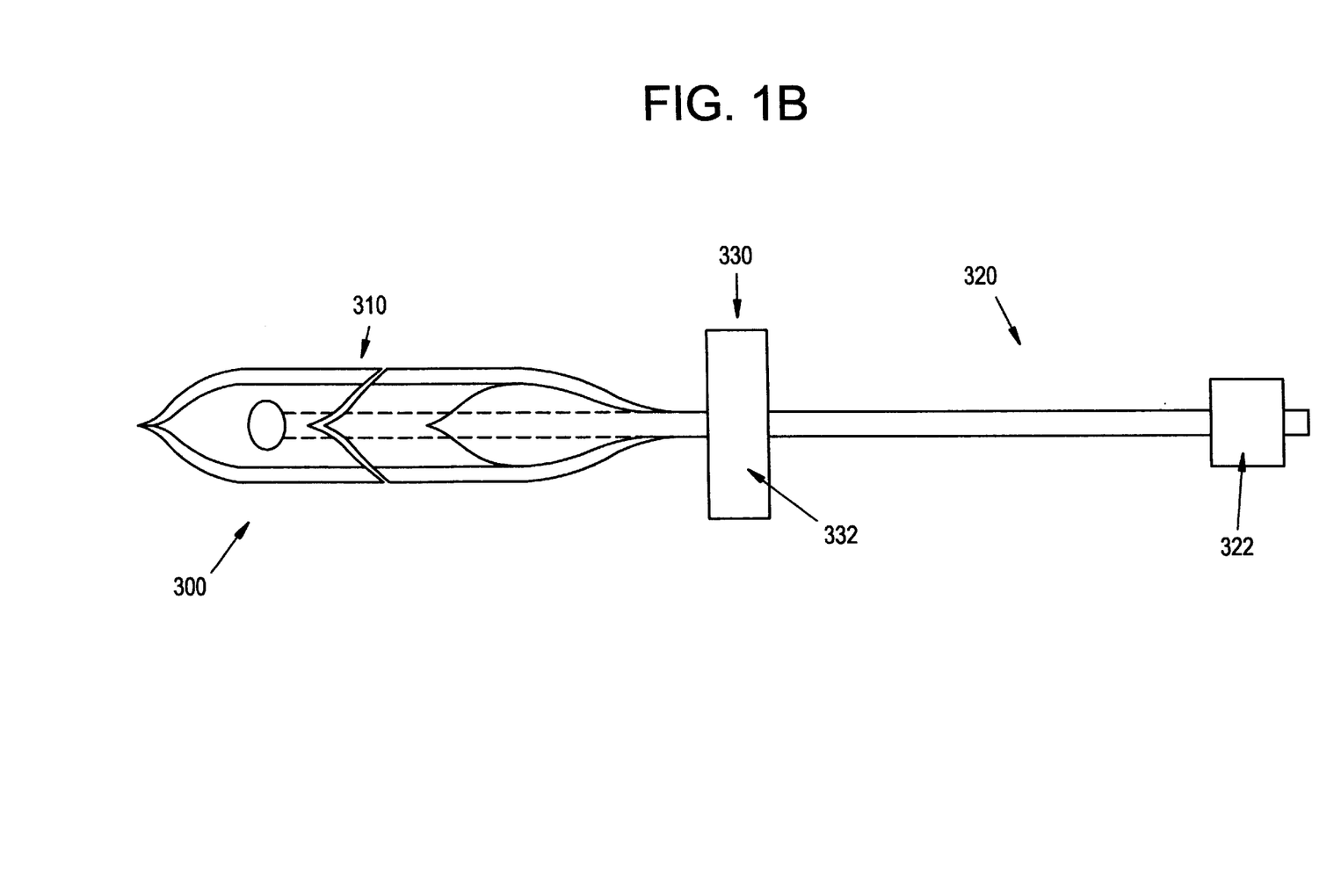
FIG. 1B illustrates the low RCS target support/sting pylon shown in FIG. 1A in greater detail.

The target sting pylon is essentially a horizontal support structure fabricated, i.e., covered, with RAM or RAS materials to achieve the required low RCS value. As shown in FIGS. 1A and 1B, the exemplary low RCS measurement system includes a target sting pylon 300 installed in the one section of the shaped low RCS measurement chamber. Advantageously, the target sting pylon 300 includes a front portion 310 and rear portion 320. A pivot member 332 is installed in the center portion 330 of the target sting pylon 300. It will be appreciated that the pivot member 332 is disposed perpendicular to the long axis of the target sting pylon 300. The target sting pylon 300 can be balanced, in an exemplary case, by a repositionable counterweight 322 connected to the distal end of rear portion 320. It will be appreciated that the counterweight 322 permits the operator to adjust the attitude of the target sting pylon 300 to compensate for changes in the weight of target 200, i.e., so that target sting pylon 300 is always coincident with the centerline of the low RCS measurement chamber.

Preferably, the target sting pylon 300 is supported by a support car 400, which advantageously runs along a pair of rails 500. In an exemplary case, the rails 500 are part of a model shop or test facility floor. It will be appreciated that the target 200 can be changed out by simply retracting the car 400, which in turn retracts the target sting pylon 300, so that operators can replace the target 200 with a second target 200'. The target sting pylon 300 is then re-balanced to the weight of the second target 200' and the sting pylon 300 is reinstalled in the low RCS measurement chamber by advancing the car 400. It will also be appreciated that changes in the attitude of the target 200 will produce corresponding changes in the moment arm of the target sting pylon 300; counterweight 322 permits the operator to compensate for such changes without accessing the low RCS measurement chamber. It will also be appreciated that the counterweight 322 beneficially compensates for a wide range of target weights.

It will be noted that the handling of the target 200 in the low RCS measurement chamber is simplified when target sting pylon 300 is installed on a rail through the rear section of the shaped measurement chamber. In particular, targets 200, 200', which are mounted on the target sting pylon 300 may be moved into or out of the measurement chamber while attached to the target sting pylon; thus, the operator do not have to install the target 200 on a support pylon fixedly installed in the measurement chamber. Moreover, it will be appreciated that the fact that personnel entry into the low RCS measurement chamber is limited will reduce the maintenance costs associated with the measurement chamber. When withdrawn into the target preparation area, the target sting pylon 300 and target 200 advantageously can be at floor level of, for example, a model shop, for ease of handling.

It should be mentioned that since the distal end of focusing element 30 is open to accommodate target sting pylon 300, RAM 32 advantageously can be omitted inasmuch as the scattered signals exiting focusing element 30 are unlikely to contribute to the background level in the RCS measurement chamber. It should also be mentioned that when RAM 32 is omitted, the space around the rear portion 320 of target sting pylon 300 preferably cannot be accessed by the operator when measurements are being conducted.

Referring now to FIGS. 1B, 2A–2D, and 3–4, it will be appreciated that the front portion 310 of target sting pylon 300 faces the radar source 100, i.e., the long axis of the target sting pylon 300 and the emitted signal from source 100 are coaxial. Preferably, the shaped tip, i.e., front portion 310, of the target sting pylon 300 is similar in shape to a "boat bow," although other configurations advantageously can be used. In an exemplary case, the front portion 310 of target sting pylon 300 is both shaped to minimize its vertical profile, i.e., its perpendicular protrusion into the measurement chamber, and treated with RAM or is fabricated from radar absorbing structure (RAS) material to further reduce the RCS return, as shown in 2A and 2D. In other words, the horizontal front portion of the target sting pylon 300 advantageously will be covered with RAS and/or RAM. Moreover, the target sting pylon 300 advantageously can have any cross sectional shape which minimizes the interaction of the emitted signal from source 100 with the target sting pylon 300 supporting the target 200 under test.

Figure 2A:
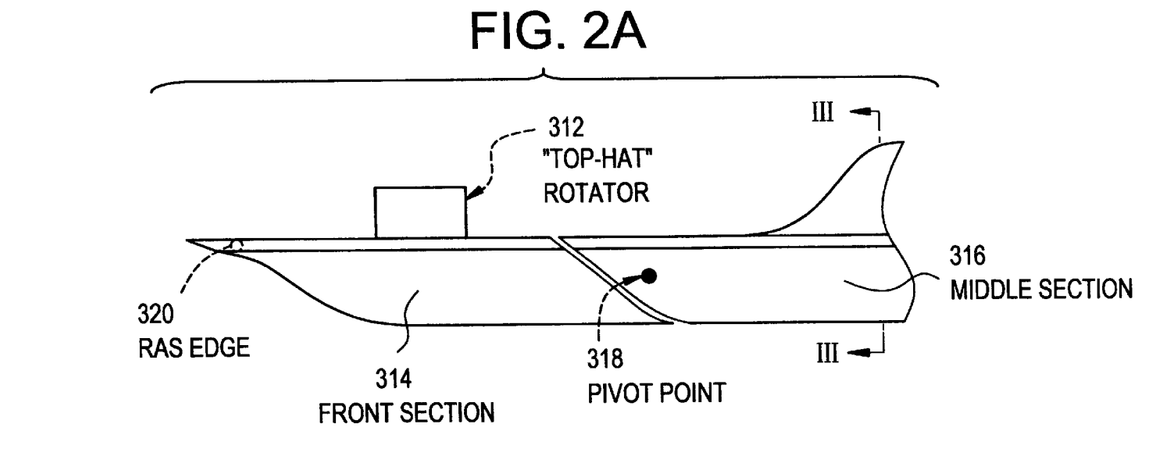
FIGS. 2A through 2D collectively illustrate the exemplary exterior construction details of the front portion of the low RCS target support/sting pylon according to the present invention.
Figure 2B:
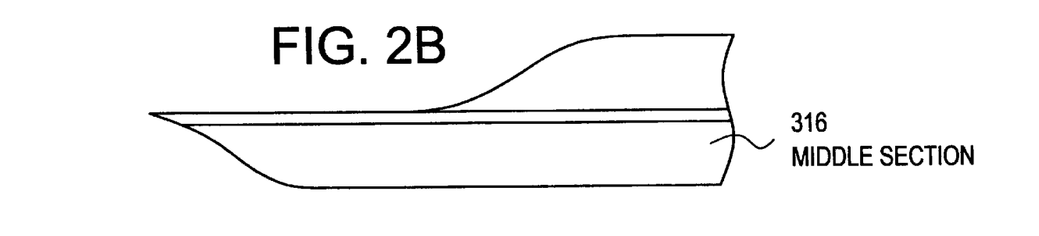
Figure 2C:
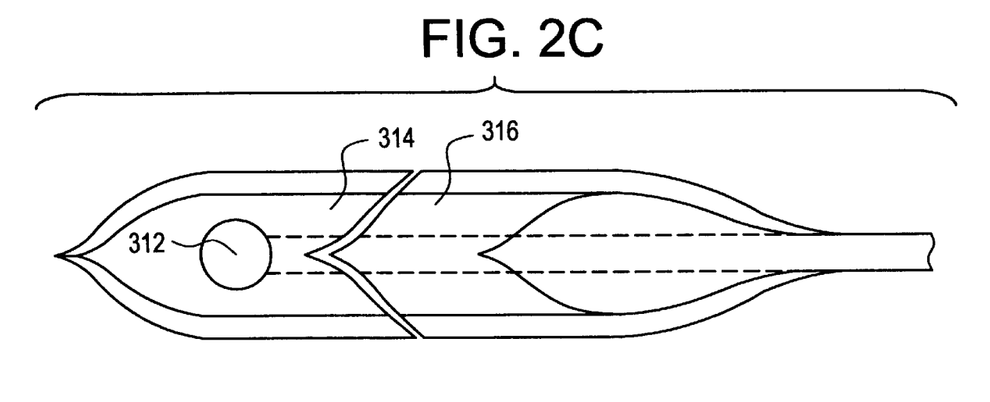
Figure 2D:
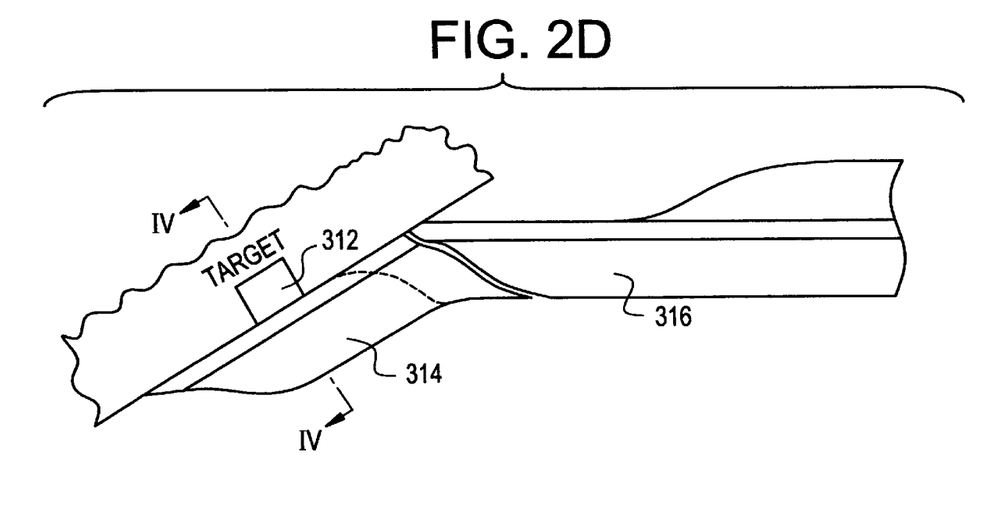
Figure 3:
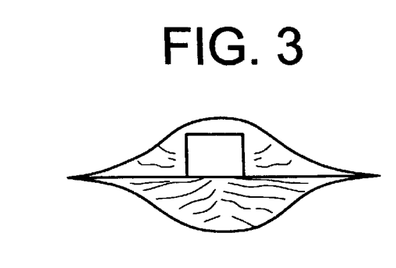
FIG. 3 is a sectional view of the low RCS target support/sting pylon according to the present invention taken along the line III—III in FIG. 2A.
Figure 4:
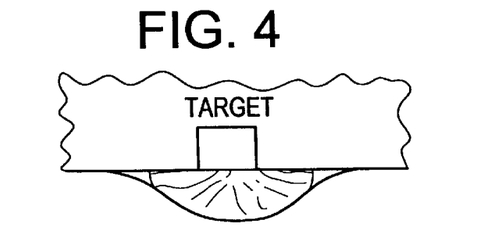
FIG. 4 is a sectional view of the low RCS target support/sting pylon according to the present invention taken along the line IV—IV in FIG. 2C.

It should be mentioned that the front portion 310 of target sting pylon 300 includes a target rotator 312, which rotator is typical of the standard rotator in use in the industry today. It will also be appreciated from FIGS. 2A that the front portion 310 includes a front section 314 operatively connected to a middle section 316 at a pivot point 318. FIGS. 3 and 4 illustrate sections of the target sting pylon 300 taken along lines III—III and IV—IV, respectively. It should be mentioned that a plurality of mechanical devices for coupling the front section 314 to middle section 316 are known, and all such devices are considered to be within the scope of the present invention. FIGS. 2A–2D, most notably FIG. 2D, advantageously illustrate the operation principle of the target sting pylon 300 whereby the target-to-pylon interface remains constant as the target 200 is tilted in elevation. As mentioned previously, since the elevation tilt axis is behind the target and since the elevation joint can be covered by an elastomeric conductive sheet (See. FIG. 2D.), the RCS contribution from the elevation joint between front portion 314 and middle portion 316 is extremely low.

The horizontal target sting pylon 300 according to the present invention, since it can be fabricated from RAM or RAS materials, advantageously will have a lower RCS value than any other known target support system. Moreover, the target sting pylon 300 advantageously provides an extremely smooth blended "boat-bow" front at the interface between the target 200 and the target sting pylon 300.

Figure 6B:
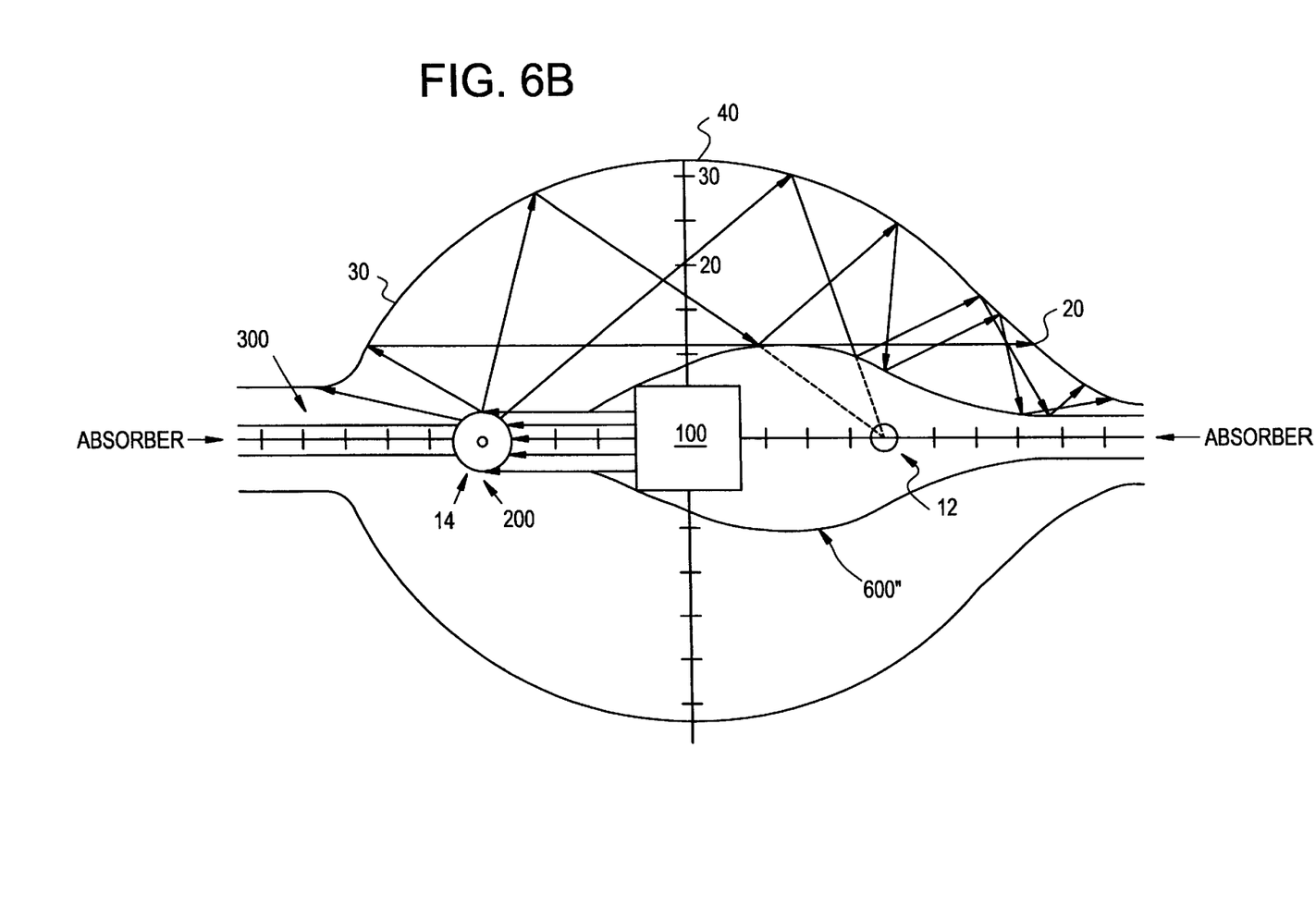
FIG. 6B illustrates an alternative exterior shape of the low RCS source support/sting pylon depicted in FIG. 6A.

As previously mentioned, FIGS. 5, 6A and 6B illustrate alternative embodiments of source support pylon 600, which advantageously both supports at least a portion of the source 100 and ensures that scattered signals directed toward a focal point coincident with the source support pylon 600 will not contribute to the background noise level in the low RCS measurement chamber. It will be appreciated that if a conventional support pylon were used, that pylon would produce scattered signals that could be received by the radar receiver associated with source 100. By using a sting pylon, which itself is a body of revolution about the long axis defined by the focal points, e.g., focal points 12, 14 and 16, as the source support pylon 600, the scattered signals directed towards the focal point 12 would be re-scattered toward focusing element 20. The effect can be most readily understood by referring to FIG. 6B.

It should be mentioned that FIG. 5 illustrates a body of rotation formed from a parabola. The source support pylon 600 in FIG. 5 includes a support surface 602 to which the source 100 advantageously can be mechanically attached. Alternatively, the source 100 beneficially can be enclosed in a more complex source support pylon, such as the source support pylon 600' illustrated in FIG. 6A or the still more complex source support pylon 600" illustrated in FIG. 6B. It will be noted that the low RCS measurement chamber illustrated in FIG. 6B includes a single elliptical chamber 40 with two focal points 12 and 14. In all cases, the geometric configuration is such that scattered signal directed toward the focal point 12 furthest from target 200 will advantageously be directed by focusing element 20 out of the low RCS measurement chamber.

Figure 7:
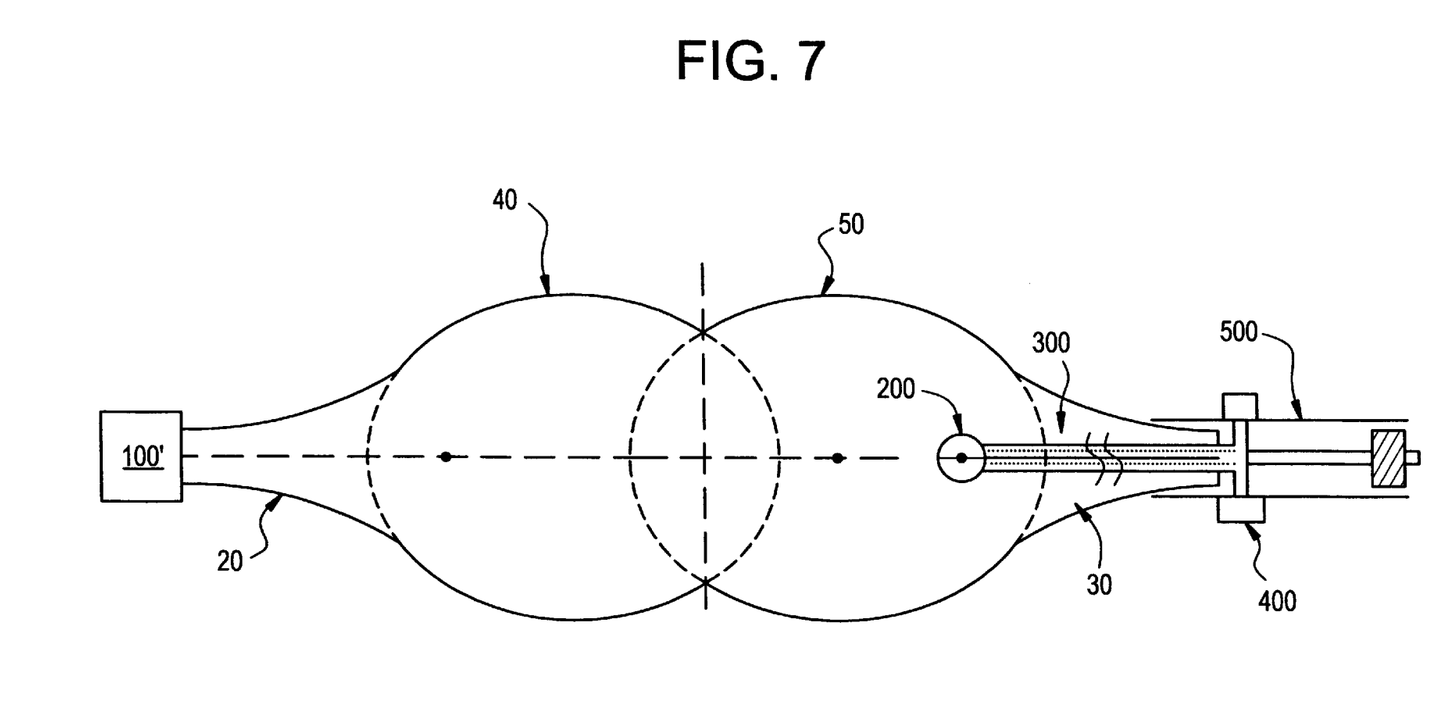
FIG. 7 illustrates a preferred embodiment of a low RCS measurement which employs only the low RCS target support/sting pylon of FIG. 1B.

It should also be mentioned that the geometric chamber arrangements illustrated in FIGS. 5–6B, with slight modifications, advantageously could be adapted to other uses. For example, the measurement chamber could be used as a "low-frequency" range provided that the self-contained source 100 and source support pylon 600 were replaced with a lens and source mechanism 100' placed deep in the hyperbolic section, i.e., focusing element 20, as illustrated in FIG. 7. Alternatively, high frequency testing, e.g., in the millimeter (mm) waveband range, could also be performed utilizing a special source 100," which is substituted for existing source 100.

In terms of system performance, the low RCS measurement system provides at least two orders of magnitude greater than that of a conventional RCS measurement chamber.

The fundamental advantage of geometrical shaping is that all but the direct path backscattered signals of the radar source back to itself can be removed from the RCS measurement chamber. As previously mentioned, configuring the RCS measurement chamber with a relatively precise "self-contained" radar system that emanates a narrow "far-field" beam at the target 200 advantageously facilitates design of such a chamber. Multiple ellipses, with common foci, are particularly advantageous for the shaped RCS measurement chamber. Preferably, each of the two outer ends of the single elliptical chamber or the serially connected elliptical chambers should be smoothly blended into an equivalent "hyperbola" to focus or force or couple the scattered signals out of the RCS measurement chamber through the focusing elements 20 and 30.

While such geometrically shaped low RCS measurement chambers advantageously will reduce the background noise level, the receiver will still receive signals other than the backscattered signals produced by target 200. The background level can be further reduced by eliminating, to the maximum extent possible, structures such as source and target support structures which have profiles which are perpendicular to the long axis of the low RCS measurement chamber or which apparently radiate from this axis. The target sting pylon 300, which is coaxial with the radiated signals from source 100 and which is located behind the target 200, advantageously presents a minimal perpendicular profile to source 100.

It will be appreciated that the RCS measurement chambers illustrated in any of FIGS. 1A and 5–7 can be fabricated as shown or rotated 90°; either orientation works equally well. These variations provide interesting possibilities for target handling and other measurement needs. It will be appreciated that vertical orientation could be expected to result in lower maintenance costs, as gravity would assist in keeping the critical areas of the RCS measurement chamber clean.

Although several preferred embodiments according to the present invention directed to a low RCS measurement chamber have been discussed in detail, it will be appreciated that the preferred present invention is no so limited. It should be mentioned that the shaped RCS measurement chamber could also be used as an antenna pattern measurement facility since the chamber shaping techniques used to minimize reflections from the chamber walls and collimating system advantageously will also optimize the fields incident on an antenna under evaluation. The shaped RCS measurement chamber could also be used as a low frequency range by replacing the collimating system, i.e., feed and reflector, with a low frequency feed and lens placed deep in the hyperbola section, as depicted in FIG. 7, behind, for example, the source illustrated in FIG. 1A.

The RCS measurement chamber according to the present invention, in addition to minimizing scattered signals interacting with the receiver, advantageously permits construction of the measurement chamber at a relatively low cost. One exemplary method of construction would simply be to scoop out a hole in the earth while using forms, i.e., a series of templates, to control the final shape of the hole. A mold would then be formed in a manner similar to forming a so-called gunnite swimming pool, i.e., install a wire mesh around the sides and along the bottom of the hole and then spray concrete over the mesh. This gunnite form would then sealed and smoothed. The resultant gunnite structure becomes the "tool" and bottom support which is employed in fabricating "swimming-pool" shells that become the top and bottom halves of the measurement chamber. It will be appreciated that craftsman such as boat-builders could lay up composite or fiberglass shells, with the first shell being formed and removed while the second shell would be formed and then left in place. It will be appreciated that the first shell would then be turned over to form the "roof" of the measurement chamber. Smaller measurement chambers could either be fabricated from separate sections or formed by other well known fabrication processes such as rotational molding.

In summary, one advantage of target sting pylon is that it provides a target support structure having an extremely low RCS signature, relative to a pylon having a substantial profile in a direction perpendicular to the axis of rotation (metal and foam pylons) and strings, since the radar is "looking" down the length of the target sting pylon. In addition, with the target elevation mechanism illustrated in FIGS. 2A–2D, which was discussed in greater detail above, the target-to-pylon interface remains constant as the target is tilted in elevation. Since the elevation tilt axis is behind the target and since the elevation joint advantageously can be covered by an elastomeric radar conductive sheet, the RCS contribution from the elevation joint is extremely low.

Although presently preferred embodiments of the present invention have been described in detail hereinabove, it should be clearly understood that many variations and/or modifications of the basic inventive concepts herein taught, which may appear to those skilled in the pertinent art, will still fall within the spirit and scope of the present invention, as defined in the appended claims.

What is claimed is:

1. A support element for a measurement chamber, which measurement chamber surrounds a target of interest intersected by a line defined by focal points associated with the measurement chamber, and which measurement chamber separates and extracts scattered signals from the measurement chamber, the measurement chamber including a chamber having an interior defined by rotation of a nonlinear curve about the line, and first and second focusing elements which couple the scattered signals out of the measurement chamber, said support element comprising:

a surface for attaching at least one of the target of interest and a source generating signals scattered by the target of interest; and a sting element, which supports said surface, which is coaxial with the line, and which is coincident with one of the focal points.

2. The support element as recited in claim 1, wherein said source is attached to said surface and wherein said sting element comprises a body of rotation about the line.

3. The support element as recited in claim 2, wherein said surface is substantially perpendicular to the line and intersects said body of rotation.

4. The support element as recited in claim 2, wherein said sting body of rotation is defined by rotation of a parabola about the line.

5. The support element as recited in claim 2, wherein said sting element directs the scattered signals into one of the first and second focusing elements.

6. The support element as recited in claim 1, wherein the target of interest is attached to said surface and wherein the target of interest is disposed between said source and said sting element.

7. The support element as recited in claim 6, wherein said sting element comprises first, second and third portions, wherein:

said first portion includes a first side defining said surface;

said second portion provides a transition between said first and third portions; and said third portion supports the weight of the target of interest and said first and second portions.

8. The support element as recited in claim 7, wherein edges of surfaces adjacent to said first surface are covered with radar absorbing material.

9. The support element as recited in claim 7, wherein said sting element further comprises a pivot element operatively coupling said first and second portions so as to permit the attitude of said first portion to vary relative to the attitude of said second portion.

10. The support element as recited in claim 9, wherein said pivot element is covered by a radar conductive sheet.

11. The support element as recited in claim 7, wherein said first side is planar and wherein all other surfaces of said first portion are smoothly blended.

12. A combination, comprising:

chamber means, which chamber means surrounds a target of interest intersected by a line defined by focal points associated with said chamber means, for separating and extracting scattered signals scattered by the target of interest, said chamber means including a chamber having an interior defined by rotation of a nonlinear curve about the line, and first and second focusing elements which couple the scattered signals out of the chamber; and support means for supporting at least one of the target of interest and a source generating signals scattered by the target of interest; wherein said support means is coaxial with the line and wherein said support means is coincident with one of said focal points.

13. The combination as recited in claim 12, wherein said support means supports said source, wherein said support means further comprises a body of rotation about the line, and wherein said support means directs the scattered signals into one of the first and second focusing elements.

14. The combination as recited in claim 13, wherein said body of rotation includes a support surface at one end which is operatively coupled to said source.

15. The combination as recited in claim 13, wherein said body of rotation is defined by rotation of a parabola about the line.

16. The combination as recited in claim 12, wherein said support means supports the target of interest, and wherein the target of interest is disposed between said source and said support means.

17. The combination as recited in claim 16, wherein predetermined surfaces of said support means are covered with radar absorbent material.

18. The combination as recited in claim 16, wherein said support means comprises:

first means for connecting said support means and the target of interest; and second means for adjusting the attitude of the target of interest with respect to said support means.

19. The combination as recited in claim 18, wherein said second means further comprises a pivot element operatively coupled to said first means, and wherein said pivot element is covered by a radar conductive sheet.

20. A measurement system comprising:

a measurement chamber system which surrounds a target of interest intersected by a line defined by focal points associated with the measurement chamber and which separates and extracts scattered signals from the measurement chamber system, said measurement chamber system including a chamber having an interior defined by rotation of a nonlinear curve about the line, and first and second focusing elements which couple the scattered signals out of said chamber;

a signal source which emits signals along the line, wherein the emitted signals interact with the chamber to thereby produce the scattered signals;

a source support pylon which supports said source and which couples the scattered signals out of said chamber; and a target support pylon, which supports the target of interest at one of said focal points, and which is coaxial with the line.

21. The measurement system as recited in claim 20, wherein said target support pylon comprises:

a first end proximate to said source to which the target of interest is attached;

a second end, which is disposed outside of said measurement chamber system, said second end further comprising means for adjusting the attitude of the target support pylon with respect to the line;

a pivot element about which said target support pylon pivots.

22. The measurement system as recited in claim 21, further comprising:

a cart supporting said target support pylon at said pivot element; and rails supporting said cart;

wherein:

the target of interest is removed from said chamber by moving said cart along said rails in a first direction; and the target of interest is installed in said chamber by moving said cart along said rails in a second direction opposite to said first direction.

23. The measurement system as recited in claim 20, wherein said source support pylon and said target support pylon are coaxial which the line.

24. The measurement system as recited in claim 20, further comprising first and second absorbing material sections which absorb the scattered signals, and which are disposed proximate to the distal ends of said first and second focusing elements, respectively.

25. The measurement system as recited in claim 20, wherein said source support pylon further comprises a body of rotation about the line, and wherein said source support pylon directs the scattered signals into one of the first and second focusing elements.

* * * * *